United States Patent [19]

Uchida

[11] Patent Number: 5,053,832
[45] Date of Patent: Oct. 1, 1991

[54] NONLINEAR RESISTANCE ELEMENT SUITABLE FOR AN ACTIVE-TYPE LIQUID CRYSTAL DISPLAY

[75] Inventor: Hiroyuki Uchida, Tokyo, Japan
[73] Assignee: NEC Corporation, Japan
[21] Appl. No.: 413,437
[22] Filed: Sep. 27, 1989

[30] Foreign Application Priority Data

Sep. 28, 1988 [JP] Japan .................. 63-245068
Sep. 28, 1988 [JP] Japan .................. 63-245070

[51] Int. Cl.$^5$ .................................... H01L 45/00
[52] U.S. Cl. .............................. 357/2; 357/51; 357/4; 357/59; 359/60
[58] Field of Search .............. 357/2, 23.7, 4, 51, 357/59 B, 59 D, 59 E, 54, 54 N; 350/339 R, 342, 333, 334

[56] References Cited

U.S. PATENT DOCUMENTS

4,490,453 12/1984 Shirai et al. .................. 357/2 X
4,737,429 4/1988 Mort et al. .................. 357/2 X
4,871,234 10/1989 Suzuki .......................... 357/2 X

FOREIGN PATENT DOCUMENTS

61-260219 11/1986 Japan.
63-291487 11/1988 Japan .................. 357/2 X

OTHER PUBLICATIONS

Toyama et al., "A Large-Area Diode-Matrix LCD SiNx Layer", 1987, pp. 155-158, SID 87 Digest, Society for Information Display International Symposium, Digest of Technical Papers, vol. XVIII, May 12, 1987, New Orleans, La., USA.

Primary Examiner—William Mintel
Attorney, Agent, or Firm—Leydig, Voit & Mayer

[57] ABSTRACT

A nonlinear diode having a first electrode, a second electrode, and a nonlinear resistance film of hydrogenated amorphous silicon nitride formed between the first and second electrodes and having an optical bandgap ranging between 2.0 and 2.2 eV. The nonlinear diode further comprises an additional hydrogenated amorphous silicon nitride film between the nonlinear resistance film and the second electrode. The additional hydrogenated amorphous silicon nitride film has an optical bandgap greater than that of the hydrogenated amorphous silicon nitride in said nonlinear film. A nonlinear diode according to the present invention may also comprise first and second electrodes and an amorphous film formed between the first and second electrodes. The amorphous film includes a first hydrogenated amorphous silicon nitride film and a second hydrogenated amorphous silicon nitride film. The first hydrogenated amorphous silicon nitride film has an optical bandgap ranging from 2.0 to 2.2 eV and the second hydrogenated amorphous silicon nitride film has an optical bandgap greater than that of the first hydrogenated amorphous silicon nitride film.

23 Claims, 7 Drawing Sheets

NONLINEAR RESISTANCE ELEMENT SUITABLE FOR AN ACTIVE-TYPE LIQUID CRYSTAL DISPLAY

BACKGROUND OF THE INVENTION

1. Field of the Invention

The present invention relates to a thin-film nonlinear diode for use in a large-area, large-capacity active-type liquid crystal display (LCD) applicable to wall-hung televisions, flat displays for computer terminal units and the like.

2. Description of the Related Art

As thin panel displays used, for example, in wall-hung color televisions, there have been developed several types of active matrix liquid crystal displays in which active elements are arrayed on a glass substrate on one side as a switch for each pixel. With this active matrix system, it becomes possible to provide a large capacity LCD without lowering display quality. Thin film nonlinear diode elements, which include a nonlinear resistance layer having conductive electrodes on both opposite sides and which are simpler in structure than thin-film transistors, are usable as active elements and are expected to reduce manufacturing cost.

Heretofore, tantalum oxide has been employed for the nonlinear resistance layer. However, the dielectric constant of this material is as large as 25. Moreover, the film thickness of this nonlinear resistance layer has to be less than 60 nm to make current flow at approximately 30 V. As a result, the stray capacitance of the nonlinear resistance element per unit area can be large. To drive the thin-film nonlinear diode element, the stray capacitance of the thin-film nonlinear diode element has to be sufficiently smaller than that of the liquid crystal. To satisfy this requirement, the area of the thin-film nonlinear diode element of tantalum oxide must be reduced to approximately 20 $\mu m^2$ or smaller It is extremely difficult to provide such microminiature elements over 14-inches diagonal area at the present level of technology.

Japanese Patent Laid-Open No. 61-260219 (issued on Nov. 18, 1986), for instance, discloses the use of a silicon oxide or silicon nitride film having a dielectric constant of 5 to 7 as a nonlinear resistance element in order to solve the capacitance problems. According to this disclosure, the silicon oxide or nitride film can have a nonlinear coefficient equal to or larger than 8 even though its thickness exceeds 100 nm, whereby a nonlinear resistance element having an area of over 100 $\mu m^2$ is usable.

However, if a nonlinear resistance element of silicon oxide or silicon nitride is used, a voltage greater than 20 V is required to produce current large enough to charge the liquid crystal, because the resistance of the silicon oxide or nitride film is still large. In this improvement, there arises another problem that a design of such high voltage drive IC for the LCD is difficult in practice.

SUMMARY OF THE INVENTION

An object of the present invention is, therefore, to provide a nonlinear diode which has a small stray capacitance and allows a large current to flow therethrough at low voltages.

A nonlinear diode according to the present invention comprises a first electrode, a second electrode, and a non-linear resistance film of hydrogenated amorphous silicon nitride formed between the first and second electrodes and having an optical bandgap ranging between 2.0 and 2.2 eV. The nonlinear diode further comprises an additional hydrogenated amorphous silicon nitride film between the non-linear resistance film and the second electrode. The additional hydrogenated amorphous silicon nitride film has an optical bandgap greater than that of the hydrogenated amorphous silicon nitride in said non-linear film.

A nonlinear diode according to the present invention may also comprise first and second electrodes and an amorphous film formed between the first and second electrodes. The amorphous film includes a first hydrogenated amorphous silicon nitride film and a second hydrogenated amorphous silicon nitride film. The first hydrogenated amorphous silicon nitride film has an optical bandgap ranging from 2.0 to 2.2 eV and the second hydrogenated amorphous silicon nitride film has an optical bandgap greater than that of the first hydrogenated amorphous silicon nitride film.

A hydrogenated amorphous silicon nitride film can be formed by a plasma CVD (Chemical Vapor Deposition) method using a mixed gas of silane and nitrogen at a flow ratio ranging from 1:10 to 1:20.

As nitrogen is added to a pure amorphous silicon film, it changes gradually from a semiconductor to an insulator. FIG. 1 shows a state of transition illustrating the relation between the $SiH_4$-$N_2$ gas mixture ratio and the optical bandgap of the film. The optical bandgap of hydrogenated amorphous silicon without nitrogen is approximately 1.65 eV. As the $N_2$ content is increased, the optical bandgap gradually increases and then at a $N_2$-$SiH_4$ flow ratio of about 50, sharply increases to about 5.3 eV, which is the optical bandgap of stoichiometric $Si_3N_4$.

Since a hydrogenated amorphous silicon nitride film having a relatively small nitrogen content and thus a narrow optical bandgap is somewhat semiconducting, it is expected that current flows more easily in it a silicon oxide or silicon nitride film. If the hydrogenated amorphous silicon nitride film with its small optical bandgap is used for a nonlinear resistance element, a sufficiently large current can be obtained at low voltages.

A detailed description will subsequently be given. For brevity, nonlinear properties are assumed to be approximated by Eq. (1).

$$I = A \cdot V^\alpha \qquad (1)$$

where A is a constant having a unit of $A/cm^2$, $\alpha$ is a nonlinear coefficient, and V is the voltage applied to the nonlinear resistance element. In general, $\alpha$ and A are functions of the thickness of the nonlinear element.

FIG. 2 shows voltage versus current characteristics of the hydrogenated amorphous silicon nitride film. The size of the element in this case is 10 $\mu m \times 10$ $\mu m$, and the film thickness thereof is 100 nm. Numerals 11, 12, 13 in FIG. 2 represent characteristics of the hydrogenated amorphous silicon nitride film with optical bandgaps 2.0 eV, 2.1 eV and 2.2 eV, respectively. The current is likely to flow as the nitrogen content is low and the optical bandgap is small.

To operate the liquid crystal, the ON current and the driving voltage have to be approximately $10^{-6}$ A and not higher than 20 V, respectively. In order to satisfy this condition, as is obvious from FIG. 2, the optical bandgap of the hydrogenated amorphous silicon nitride film is equal to or smaller than 2.2 eV. To operate the liquid crystal, moreover, the nonlinear coefficient $\alpha$ is required to be equal to or larger than 7. Accordingly, the optical bandgap is required to be equal to or larger than 2.0 eV to satisfy this condition of α.

As described above, a nonlinear resistance element suitable for a switching element for an LCD can be obtained by using the hydrogenated amorphous silicon nitride film with an optical bandgap ranging from 2.0 eV to 2.2 eV as a nonlinear resistance element.

Incidentally, nonlinear diodes of silicon nitride are disclosed in "Society of Information Display International Digest of Technical Papers" Vol. XVIII, 1987, P. 156. However, the atomic ratio of N/Si of this silicon nitride is around 0.7 as described in the Characterics column on page 156, and this atomic ratio corresponds to an optical bandgap of greater than 2.2 eV. Therefore, a liquid crystal cell using this silicon nitride nonlinear diode requires a driving voltage greater than 20 V. From the inventor's measurements on atomic ratios of N/Si of the hydrogenated amorphous silicon nitride films with a Rutherford Backscattering method, optical bandgaps of 2.0 eV and 2.2 eV correspond to atomic ratios of N/Si of 0.5 and 0.65, respectively.

Moreover, the hydrogenated amorphous silicon nitride film can be formed by a plasma CVD method using the mixed gas of SiH$_4$ and N$_2$ with a flow ratio of SiH$_4$ to N$_2$ ranging from 1:10 to 1:20. Although NH$_3$ can be used instead of N$_2$ as a starting gas, N$_2$ is preferred because the film formed with NH$_3$ easily breaks down.

The film thickness of the hydrogenated amorphous silicon nitride film is preferably from 100 nm to 200 nm. The reason for this is that, since the current is determined by the electric field, a driving voltage of greater than 20 V is needed for a film thickness of 200 nm. On the other hand, when the thickness is smaller than 100 nm, the capacitance of the diode becomes too large. FIG. 3 shows the dependence of the dielectric constant of the hydrogenated amorphous silicon nitride film on the N$_2$/SiH$_4$ flow ratio. An hydrogenated amorphous silicon nitride film with an optical bandgap ranging from 2.0 eV to 2.2 eV which is prepared N$_2$/SiH$_4$ flow ratio ranging from 10 to 20, has a dielectric constant ranging from 10 to 12. This which is close to the dielectric constant of amorphous silicon without nitrogen, which is 12. On the other hand, the dielectric constant of the silicon oxide or silicon nitride film disclosed in the Japanese Patent Laid-Open No. 61-260219 ranges from 5 to 7 and is smaller than that of the hydrogenated amorphous silicon nitride film according to the present invention. However, the value of the latter still remains smaller than that of tantalum oxide, which is approximately 25. Even though the dielectric constant is as large as 11 and even though the area of the element is as large as over 50 μm$^2$ at which etching is facilitated, practically no problem will be posed with a film thickness over 100 nm.

Since the hydrogenated amorphous silicon nitride film is formed by a plasma CVD method, however, the surface of a first electrode beneath the film or the interface between the first electrode and the film may change in quality, so that the characteristics of the nonlinear diode may deteriorate.

As shown in FIG. 4, when a diode was manufactured by forming an ITO (Indium Tin Oxide) film 42 as a lower electrode on a glass substrate 41, a hydrogenated amorphous silicon nitride film 44 as a nonlinear diode film with an optical bandgap ranging from 2.0 eV to 2.2 eV thereon by a plasma CVD method, and an upper electrode 45 of a metal such as chrome on the film 44, the surface of the ITO film 42 was seen to change in quality and simultaneously become slightly opaque and black. In addition, a shortcircuiting breakdown occurred at an applied voltage of several volts resulting in a number of point defects.

Although the phenomenon of this change in quality due to plasma has not yet been clarified, it is considered attributable to the following: Since the transparent conductive film, such as the ITO, forming the display electrode is an oxide, it is reduced when it is exposed to hydrogen plasma. The reduction may result in making the surface slightly opaque and black. The altered surface of the ITO becomes rough and rugged. The nonlinear diode is therefore easy to shortcircuit. When a hydrogenated amorphous silicon nitride film containing a high percentage of nitrogen with a large optical bandgap is formed on the transparent conductive film, the transparent conductive film does not deteriorate because the flow rate of silane (SiH$_4$) gas is low. In the case of a hydrogenated amorphous silicon nitride film with a narrow optical bandgap ranging from 2.0 to 2.2 eV, a reducing atmosphere is readily created because the flow rate of SiH$_4$ gas is high and accordingly the ITO film tends to deteriorate easily.

Therefore, by forming a thin film of hydrogenated amorphous silicon nitride with a large optical bandgap on an ITO film 42 and forming a hydrogenated amorphous silicon nitride film with an optical bandgap ranging from 2.0 to 2.2 eV thereon, the surface of the ITO film does not change in quality and the characteristics of the nonlinear diode maintained. With this structure, the ITO film is not reduced because the flow ratio of SiH$_4$ gas is low initially.

FIG. 5 is a sectional view of a thin nonlinear diode element thus formed.

An ITO film 42 as a lower electrode is formed on a glass substrate 41. A hydrogenated amorphous silicon nitride film 44 containing a high percentage of nitrogen with a large optical bandgap is formed on the ITO film 42 and another hydrogenated amorphous silicon nitride film 44 with an optical bandgap ranging from 2.0 to 2.2 eV is formed on the film 43 in such a manner as to cover the film 43. An upper electrode 45 made of metal such as chrome or aluminum is formed thereon.

Importance should be attached to the thickness of the hydrogenated amorphous silicon nitride film 43 with the large optical bandgap. If the film is too thick, current is restricted by this layer and can hardly flow through the thin nonlinear diode element.

FIG. 6 shows current versus voltage characteristics when the thickness of the hydrogenated amorphous silicon nitride film with the large optical bandgap is changed.

In FIG. 6, the characteristic curve 22 for a structure with the first layer 43 having a thickness of 5 nm is shifted by 1 V toward the high voltage side, compared with the curve 21 for the conventional structure without the first layer 43. Thus, practically no problem exceeds 5 nm, the characteristic curve has shifted toward the high voltage side conspicuously; e.g., the characteristic curve 23 of a 10 nm layer has shifted by 5 V. Since current necessary for turning on a liquid crystal is approximately 1 μA, approximately 18 V must be applied to the thin linear diode element in the case of the characteristic curve 23. When the thickness of the first layer 43 is increased to 20 nm, the flow of the current suddenly decreases as shown by characteristic curve 24. The thickness of the first layer 43 is preferably less than 10 nm to decrease the drive voltage to 20 V or lower. With respect to the surface roughness of the ITO film 42, the ITO film 42 is prevented from changing in quality, provided approximately one atomic layer (that is about 0.5 nm) of hydrogenated amorphous silicon nitride film 43 with a large optical bandgap is formed, though the hydrogenated amorphous silicon nitride film 44 with a small optical bandgap is formed thereon.

The conditions under which the hydrogenated amorphous silicon nitride film 43 causes no deterioration of the ITO film 42 mainly depend on the silane-to-nitrogen flow ratio as that of starting gas. When the silane-to-nitrogen flow ratio is no higher than 0.02, no deterioration is observed. However, a film prepared under this condition is almost an insulator and its optical bandgap exceeds 2.5 eV. The hydrogenated amorphous silicon nitride film 44 with the small optical bandgap is formed at a high flow rate of silane with a silane-to-nitrogen flow ratio not smaller than 0.02 and preferably from 0.05–0.1. That is, a silicon nitride film showing high nonlinearity and an insulating silicon nitride film can continuously be formed only by controlling the flow rate of silane, so that the present invention can be implemented without increasing the number of processing steps.

When the electrode provided beneath the hydrogenated amorphous silicon nitride film is a metal such as chrome instead of an ITO film, it is free from reduction and therefore deterioration of its characteristics. However, there occurs the problem that the voltage versus current characteristics become asymmetrical with respect to the negative and positive of the voltage.

Referring to FIG. 4 again, a metal electrode of, e.g., chrome as the lower electrode 42 is formed beneath the glass substrate 41. The hydrogenated amorphous silicon nitride film 44 with an optical bandgap ranging from 2.0 to 2.2 eV as the nonlinear diode layer is formed on the electrode 42 by the plasma CVD method and the upper electrode 45 of a metal such as chrome is formed on the film 44. The diode element is thus completed. The lower electrode 42 is connected to a pixel electrode (not shown) formed with a transparent conductive film of ITO.

The hydrogenated amorphous silicon nitride film 44 with a small optical bandgap has conspicuous semiconductive properties and indicates a Schottky contact with its electrode to show rectifying properties. When a thin nonlinear diode in which the negative and positive are asymmetrical in the voltage versus current characteristics is employed as a switching element, flickers are generated in the display, thus deteriorating the display quality An insulating hydrogenated amorphous silicon nitride film with an optical bandgap exceeding 2.3 eV shows excellent symmetry in the voltage versus current characteristics under a high electric field. The conduction mechanism of the carrier in the insulating hydrogenated amorphous silicon nitride film is considered as that of the Poole-Frenkel conduction. The Poole-Frenkel type conduction is a bulk effect and not dependent on the characteristics of the electrode interface. The influence of the characteristics of the contact between the electrode and the hydrogenated amorphous silicon nitride film is therefore considered ignorable.

If the flow rate of silane ($SiH_4$) is increased to make a film rich in silicon, the optical bandgap decreases to that of the hydrogenated amorphous silicon nitride film and semiconductive properties are also developed. The possible reason for the emergence of asymmetry at approximately 2.1 eV is that a Schottky barrier is formed and that, because the surface of the lower electrode is exposed to the plasma, the Schottky barrier becomes greater than the upper electrode 45. Supposing electrons are carriers which contribute to conduction, the electrons are readily injected from the upper electrode 45 but hardly so from the lower electrode 42.

To make symmetric the voltage versus current characteristics of the hydrogenated amorphous silicon nitride film with a narrow optical bandgap, electrons should be equally injected from both upper and lower electrodes. In other words, a film is inserted onto the upper electrode 45 to restrict the injection of electrons so as to control the amount of the current to make the characteristics symmetrical.

A quasi-insulating hydrogenated amorphous silicon nitride film can practically be usable as a layer for preventing the injection of electrons. The quasi-insulating hydrogenated amorphous silicon nitride film with an optical bandgap of not lower than 2.3 eV should be inserted in between the hydrogenated amorphous silicon nitride film with a small optical bandgap and the upper electrode 45.

FIG. 7 is a sectional view of the thin nonlinear diode element thus formed.

A metal electrode of chrome or the like as the lower electrode 42 is formed on the glass substrate 41. This metal electrode is connected to the display electrode formed of ITO. The hydrogenated amorphous silicon nitride film 44 with an optical bandgap ranging from 2.0 to 2.2 eV, the nonlinear resistance element, and the insulating hydrogenated amorphous silicon nitride film 46 containing a high percentage of hydrogen are laminated thereon in such a manner as to cover the lower electrode 42. The upper electrode 45 of a metal such as chrome, aluminum or the like is formed on the combination above.

FIG. 8 show characteristics of the nonlinear diode element with a double layer. In FIG. 8, the x-axis represents the voltage applied to the nonlinear element and the positive values correspond to positive voltages applied to the upper electrode 45 relative to the lower electrode 42. With respect to the current, a negative current flows when a negative voltage is applied, but the current is shown as an absolute value in FIG. 8. As shown by broken lines, which represent the characteristics of an element using only the hydrogenated amorphous silicon nitride film 44 with an optical bandgap ranging from 2.0 to 2.2 eV, the characteristic on the negative voltage side is greater by one digit than what is shown on the positive voltage side. As shown by solid lines, which represent the characteristics of an element having a double-layer structure using the hydrogenated amorphous silicon nitride film 46, the current on the negative voltage side decreases and conforms to what is shown on the positive voltage side. The positive voltage side remains unaffected by the quasi-insulating hydrogenated amorphous silicon nitride film 46.

The current on the negative voltage side is controllable by changing the thickness of the quasi-insulating hydrogenated amorphous silicon nitride film 46. If the film thickness is increased too much, the influence of the insulating hydrogenated amorphous silicon nitride film 46 appears on the positive voltage side. If the film thickness is not greater than 10 nm, the characteristics on only the negative voltage side are changed, to confirming the possibility of making the voltage versus current characteristics symmetrical. Moreover, the thickness of the hydrogenated amorphous silicon nitride film is preferably not less than 1 nm. If the film thickness is smaller than 1 nm, a tunneling current begins to flow and it becomes difficult to control the current.

Even in a structure having the lower electrode formed of ITO, a thin hydrogenated amorphous silicon nitride film with a large optical bandgap for preventing the ITO film from being reduced and a hydrogenated amorphous silicon nitride film with an optical bandgap ranging from 2.0 to 2.2 eV laminated in order, the hydrogenated amorphous silicon nitride film with a large optical bandgap is formed just above the ITO film. Therefore, electrons are not readily injected from the ITO side and the voltage versus current characteristics become asymmetrical. In this case, the voltage versus current characteristics can be made symmetrical by providing a thin hydrogenated amorphous silicon nitride film of a large optical bandgap between the hydrogenated amorphous silicon nitride film with an optical bandgap ranging from 2.0 to 2.2 eV and the upper electrode.

BRIEF DESCRIPTION OF THE DRAWINGS

The above and further objects, features and advantages of the present invention will become more apparent from the following detailed description taken in conjunction with the accompanying drawings, wherein.

DESCRIPTION OF THE PREFERRED EMBODIMENTS (First Embodiment)

Figure 9:
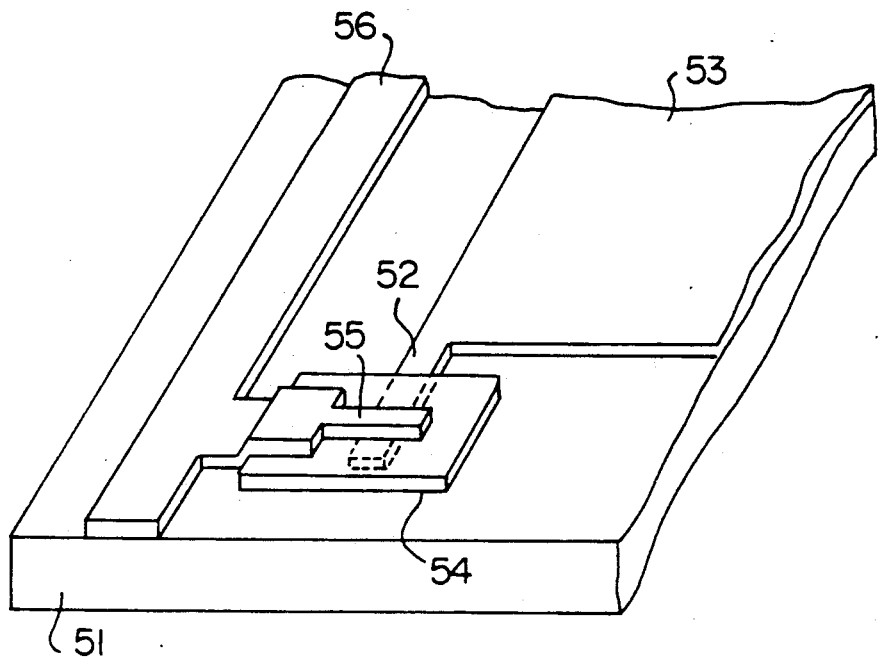
FIG. 9 is a perspective view illustrating the structure of a nonlinear diode element for explaining a first embodiment of the present invention.

Referring to FIG. 9, a description will be given of a first embodiment of the present invention. An transparent conductive ITO film was first formed by sputtering on a glass substrate 51. The thickness and the sheet resistance of the film were 70 nm and 50 $\Omega/\square$, respectively. A display electrode 53 and a lower electrode 52 of a nonlinear resistance element connected to the display electrode 53 were subsequently formed by photolithography. A hydrogenated amorphous silicon nitride film 54 as a nonlinear resistance element was formed by the plasma CVD method. The conditions under which the film was formed included 30 SCCM of $SiH_4$, 500 SCCM of $N_2$, a vacuum degree of 100 Pa, a high-frequency power of 200 W, and a substrate temperature of 250° C. Under these conditions, a hydrogenated amorphous silicon nitride film with an optical bandgap of 2.1 eV was obtained. The hydrogenated amorphous silicon nitride film 54 was then processed by photolithography into an island-like shape. This step was taken to remove the hydrogenated amorphous silicon nitride film with an optical bandgap of approximately 2.1 eV on the display electrode because the film had been yellowed. Further, a Cr film 200 nm thick was formed by sputtering and an upper electrode 55 and a data line 56 of the nonlinear resistance element were formed by etching. An alignment film was formed on the active element substrate thus formed and the substrate was stuck to an opposite substrate. Liquid crystal was then injected to complete an LCD.

When the LCD thus formed was driven at 1/400 duty and 16 V in drive voltage, a 60-to-1 contrast was obtained. Production of a large-capacity, high-quality LCD was materialized at a voltage lower than 20 V by employing a hydrogenated amorphous silicon nitride film with an optical bandgap ranging from 2.0 to 2.2 eV as a nonlinear resistance element.

Although ITO was used for the lower electrode in this embodiment, metal such as chrome may be used. Moreover, ITO or other kinds of metal may be employed for the upper electrode. By turning the electrodes upside down, the data line may be connected to the lower electrode and the display electrode to the upper electrode.

(Second Embodiment)

Figure 1:
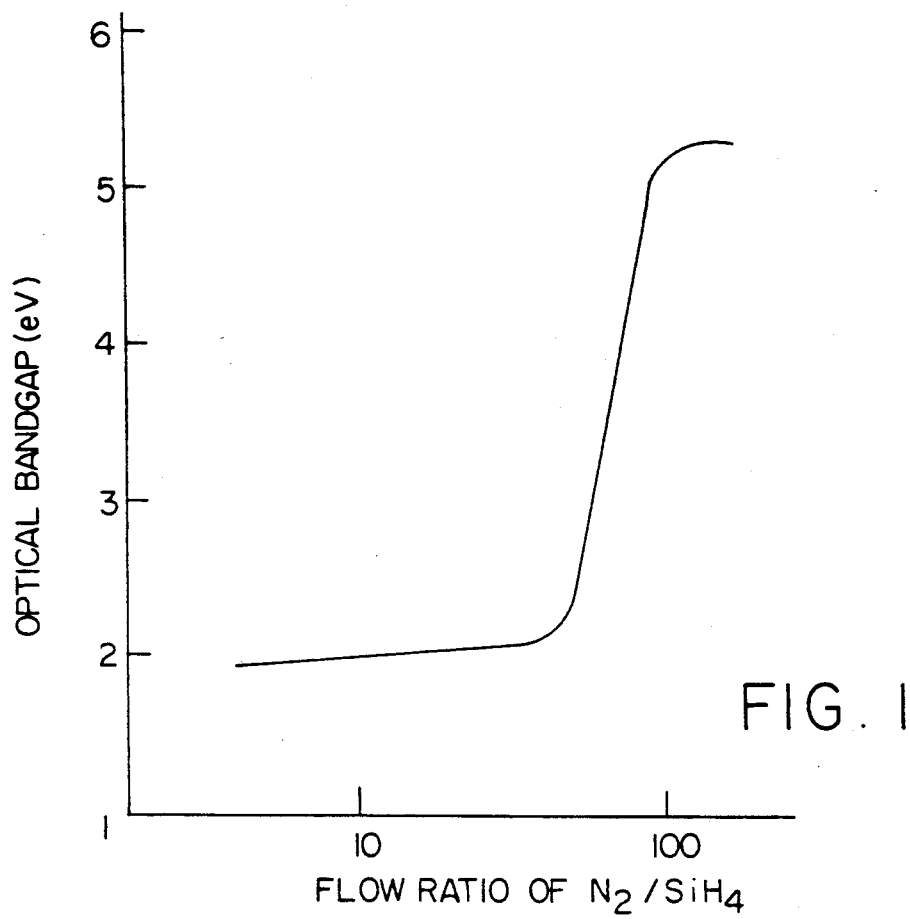
FIG. 1 is a characteristic diagram showing the dependence of the optical bandgap of a hydrogenated amorphous silicon nitride film on a flow rate of $N_2/SiH_4$.
Figure 2:
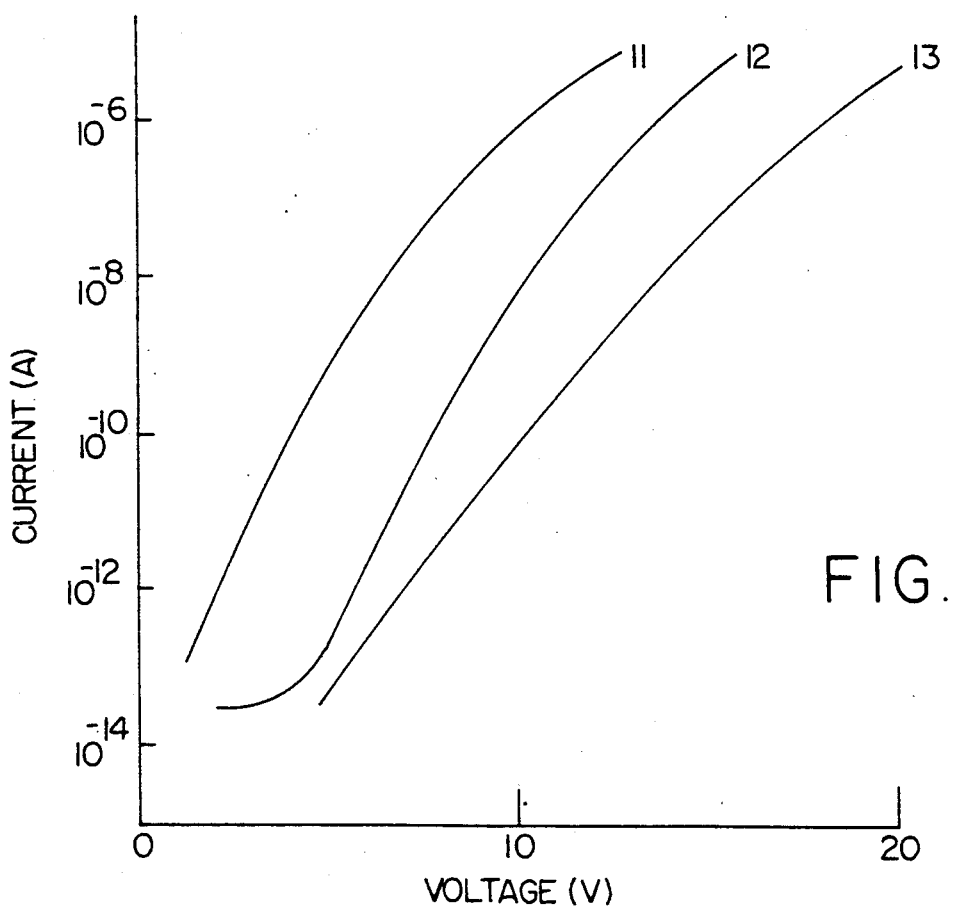
FIG. 2 is a characteristic diagram showing the dependence of the current of the hydrogenated amorphous silicon nitride film on the voltage.
Figure 3:
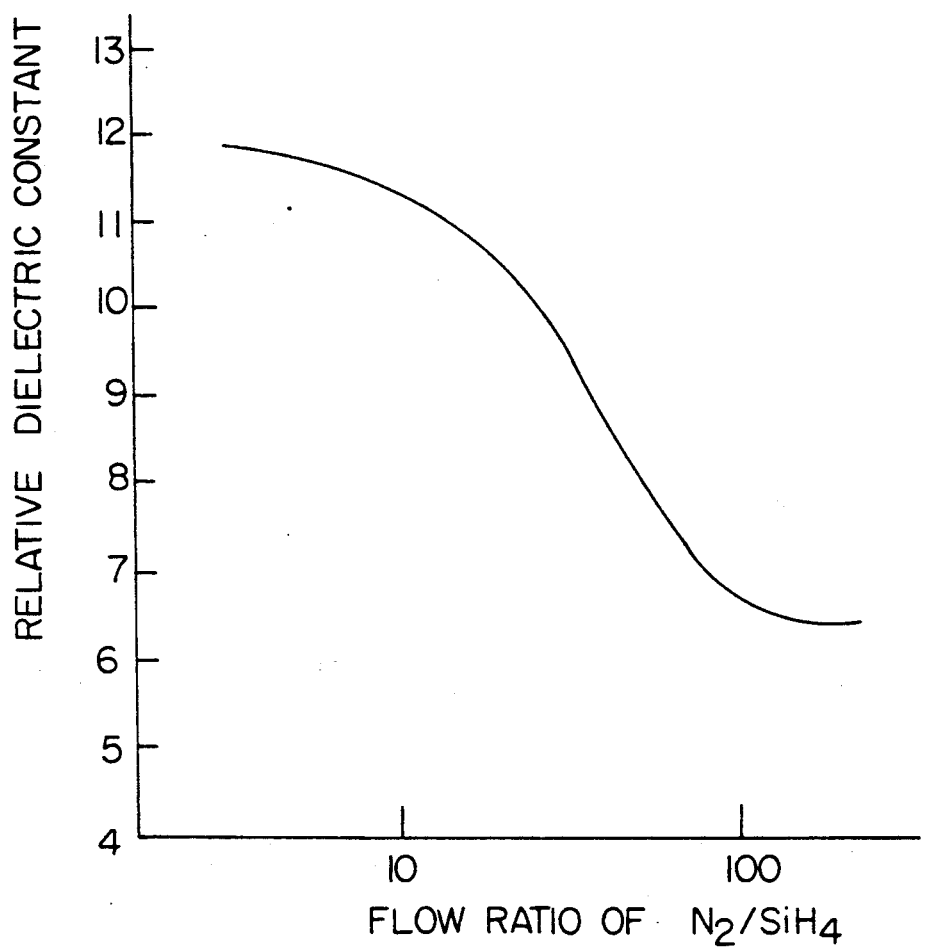
FIG. 3 is a characteristic diagram of the dependence of the dielectric constant of the hydrogenated amorphous silicon nitride film on the flow rate of $N_2/SiH_4$.
Figure 4:
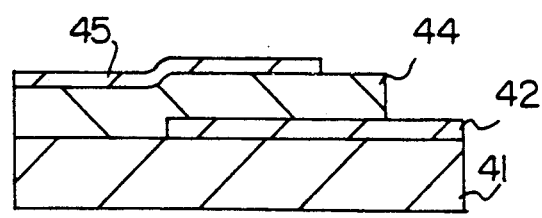
FIGS. 4, 5 and 7 are sectional views for explaining the present invention.
Figure 5:
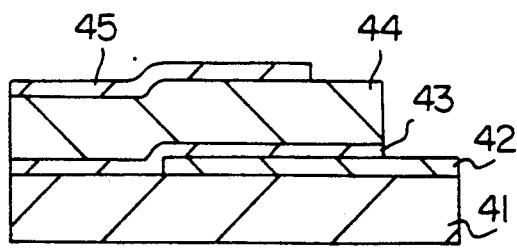
Figure 6:
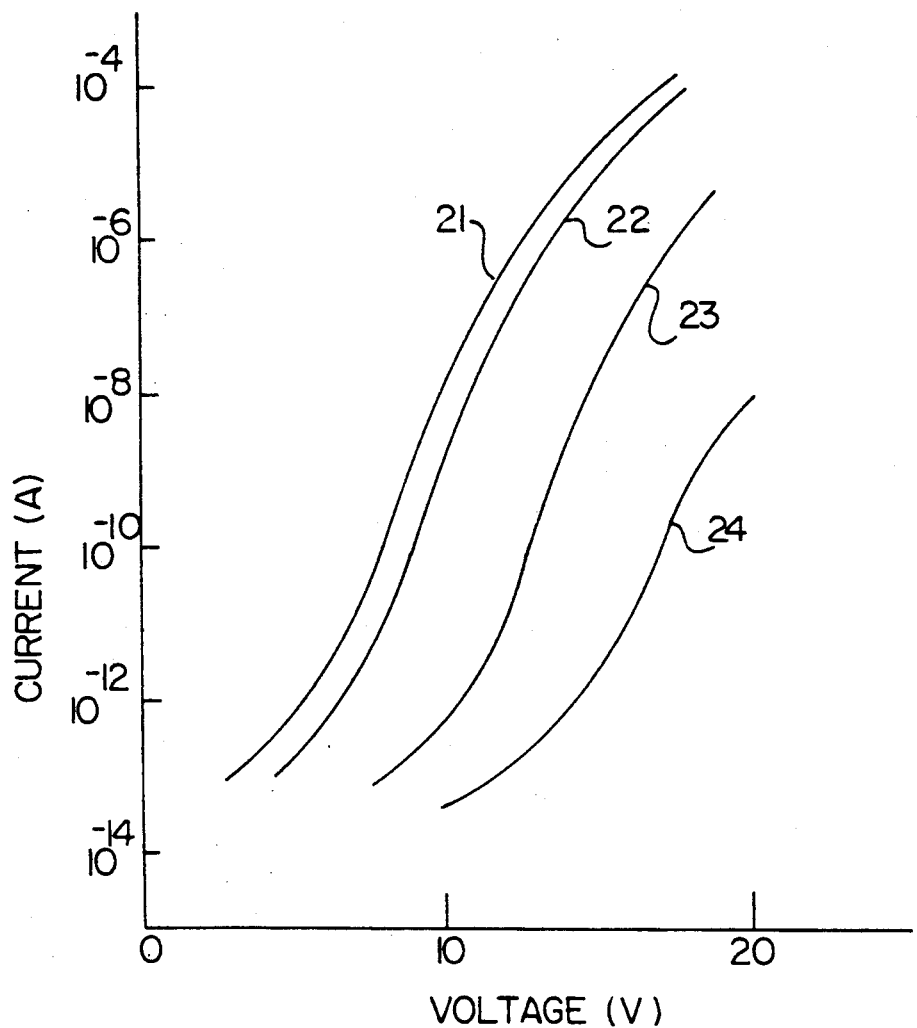
FIGS. 6 and 8 are voltage versus current characteristic diagrams for a structure having a thin hydrogenated amorphous silicon nitride film with a large optical bandgap and a hydrogenated amorphous silicon nitride film with a small optical bandgap.
Figure 7:
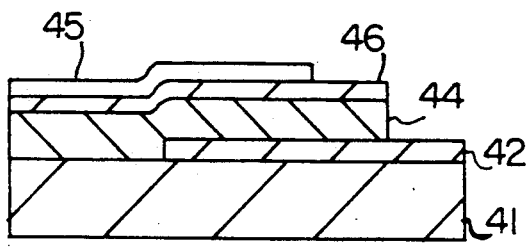

A hydrogenated amorphous silicon nitride film 54 was formed by a plasma CVD method under the condition of an $N_2$ flow rate of 450 SCCM, an $SiH_4$ flow rate of 30 SCCM, a pressure of 100 Pa, a high-frequency power of 200 W, and a substrate temperature of 250° C. Under these conditions, a hydrogenated amorphous silicon nitride film with an optical bandgap of 2.1 eV was obtained. This film exhibited current versus voltage characteristics shown by curve 12 of FIG. 2 when it was 100 nm thick. The nonlinear coefficient was 11 and the current reached $10^{-6}$A at approximately 10 V. Consequently, this film is usable as a switching element for a liquid crystal that can be driven at low voltages.

(Third Embodiment)

Figure 10:
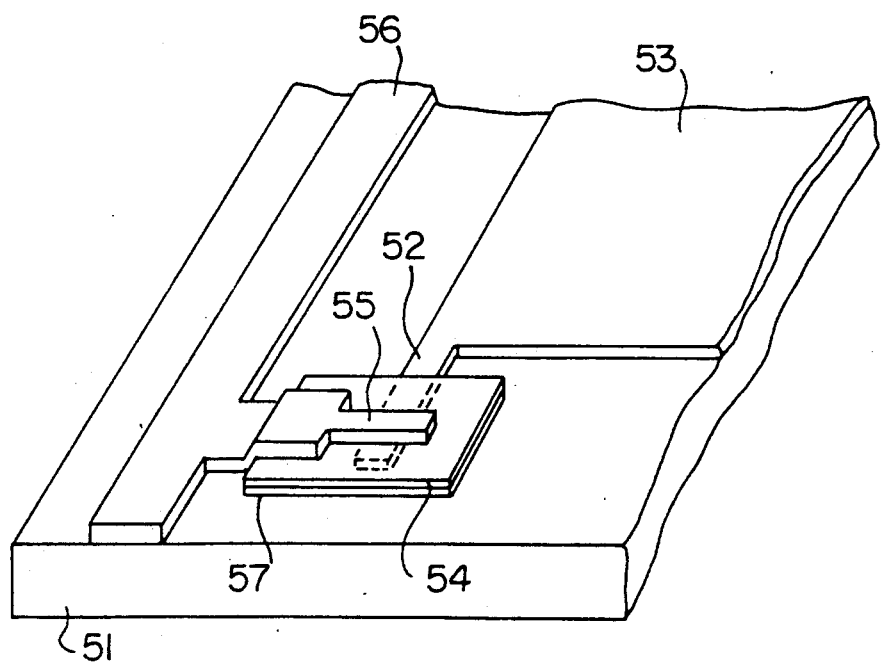
FIG. 10 is a perspective view illustrating the structure of a nonlinear diode element for explaining a third embodiment of the present invention.

Referring to FIG. 10, an ITO film as a transparent conductive film was formed by sputtering on the glass substrate 51. The film thickness and the sheet resistance of the film obtained were 50 nm and 70 $\Omega/\square$, respectively. The ITO film was etched by photolithography to form a display electrode 53 and a lower electrode 52 of a nonlinear resistance element connected to the display electrode 53. Then an insulating hydrogenated amorphous silicon nitride film 57 of 30 nm thick was formed on the lower electrode 52 of ITO. The conditions included 5 SCCM of $SiH_4$, 500 SCCM of $N_2$, a pressure of 100 Pa, a high-frequency electrode density of 0.08 W/cm², and a substrate temperature of 250° C. Under these conditions, a hydrogenated amorphous silicon nitride film with an optical bandgap of 4 eV was obtained.

Subsequently, a hydrogenated amorphous silicon nitride film 54 with a small optical bandgap was formed by the plasma CVD method. The conditions included 30 SCCM of $SiH_4$, and 500 SCCM of $N_2$, the remainder being the same as the case of the hydrogenated amorphous silicon nitride film 57. Under these conditions, a hydrogenated amorphous silicon nitride film with an optical bandgap of 2.1 eV was obtained. The hydrogenated amorphous silicon nitride films 54 and 57 were then processed by photolithography into an island-like shape. Further, a 200 nm thick Cr film was formed by sputtering and an upper electrode 55 and a data line 56 of the nonlinear resistance element were formed by etching. An alignment film was formed on the active element substrate in the aforementioned manner and the substrate was stuck to an opposite substrate. Liquid crystal was then injected to complete an LCD, the size of which was 10-inches diagonal (640×400 pixels).

When the LCD thus formed was driven at 1/400 duty and 16 V in drive voltage, a 45-to-1 contrast was obtained. With respect to defects, a panel free from any defects was formed at a yield rate as high as 60%. Moreover, the source of each defect was ascribed to photolithography and no shortcircuiting of the nonlinear element itself was observed. Production of a large-capacity, high-image-quality LCD free from defects was materialized at a voltage lower than 20 V.

(Fourth Embodiment)

Figure 11:
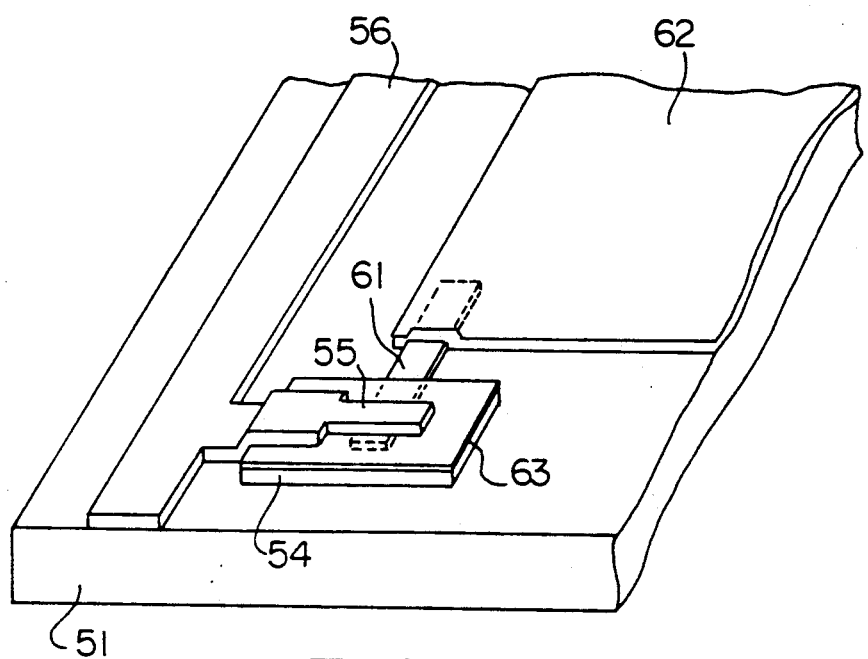
FIG. 11 is a perspective view illustrating the structure of a nonlinear diode element for explaining a fourth embodiment of the present invention.

Referring to FIG. 11, a 40 nm thick chrome film was formed by sputtering on a glass substrate 51 and then processed by photolithography into an island-like shape to provide a lower electrode 61. A hydrogenated amorphous silicon nitride film as a nonlinear resistance film 54 was formed by the plasma CVD method on the lower electrode 61. The conditions included 30 SCCM of $SiH_4$, and 500 SCCM of $N_2$, a pressure of 100 Pa, a high-frequency electrode density of 0.08 W/cm$^2$, and a substrate temperature of 250° C. Under these conditions, a hydrogenated amorphous silicon nitride film 54 with an optical bandgap of 2.1 eV was obtained. Subsequently, an insulating hydrogenated amorphous silicon nitride film 63 of 5 nm thick was piled thereon. The conditions included 5 SCCM of $SiH_4$, and 500 SCCM of $N_2$, the remainder being the same as the case of the hydrogenated amorphous silicon nitride film 54. Under these conditions, a hydrogenated amorphous silicon nitride film 63 with an optical bandgap of 4 eV was obtained. The laminated hydrogenated amorphous silicon nitride film 54 was then processed by photolithography into an island-like shape.

A 200 nm thick aluminum film was formed by sputtering and an upper electrode 55 and a data line 56 of the thin nonlinear resistance element were formed by etching. Then an ITO film was formed by sputtering and was etched to form a pixel electrode 62. A film opposite to the active element substrate thus formed was formed and stuck to an opposite substrate. Liquid crystal was then injected to complete an LCD, the size of which was 10-inches diagonal with 640×400 in the number of pixels.

Figure 8:
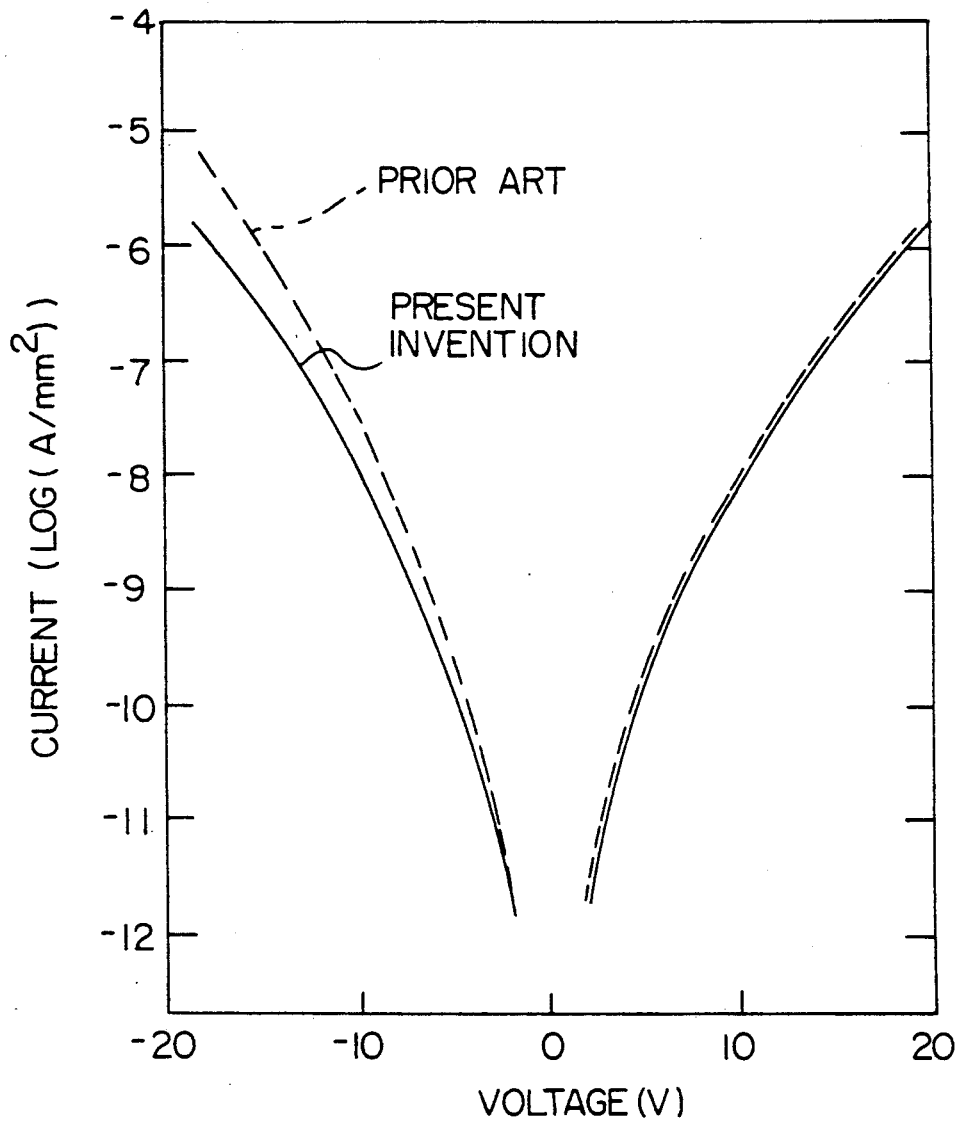

The characteristics of the nonlinear diode shown in FIG. 8 are those of the element thus formed and demonstrate excellent symmetry. When the LCD thus formed was driven at 1/400 duty and 16 V in drive voltage, a 45-to-1 contrast was obtained. With respect to the flicker, it was changed from −25 to −37 db and this shows an improvement by a large margin, compared with a case where the conventional hydrogenated amorphous silicon nitride film with a small optical bandgap is employed.

As set forth above, the insulating hydrogenated amorphous silicon nitride film is inserted in between the upper electrode and the hydrogenated amorphous silicon nitride film as the nonlinear resistance film according to the present invention. Therefore, the voltage versus current characteristics can be symmetrical without increasing the number of processing steps. As a result, flickers are prevented.

What is claimed is:

1. A non-linear diode comprising:
   a first electrode;
   a second electrode;
   a non-linear resistance film of hydrogenated amorphous silicon nitride formed between said first and second electrodes, said hydrogenated amorphous silicon nitride film having an optical band gap ranging between 2.0 and 2.2 eV; and
   an additional hydrogenated amorphous silicon nitride film between said non-linear resistance film and said second electrode, said additional hydrogenated amorphous silicon nitride film having an optical band gap greater than that of said hydrogenated amorphous silicon nitride in said non-linear resistance film.

2. A nonlinear diode as claimed in claim 1, wherein the optical bandgap of said additional hydrogenated amorphous silicon nitride film is greater than 2.3 eV.

3. A nonlinear diode as claimed in claim 1, wherein the thickness of said additional hydrogenated amorphous silicon nitride film ranges from 1 nm to 10 nm.

4. A nonlinear diode as claimed in claim 1, wherein said second electrode is made of indium tin oxide.

5. A nonlinear diode as claimed in claim 4, wherein the optical bandgap of said additional hydrogenated amorphous silicon nitride film is equal to or larger than 2.5 eV.

6. A nonlinear diode as claimed in claim 4, wherein the thickness of said additional hydrogenated amorphous silicon nitride film ranges from 0.5 nm to 10 nm.

7. A nonlinear diode comprising:
   a first electrode;
   a second electrode;
   an amorphous film formed between said first and second electrodes, said amorphous film comprising a first hydrogenated amorphous silicon nitride film and a second hydrogenated amorphous silicon nitride film, said first hydrogenated amorphous silicon nitride film having an optical band gap ranging between 2.0 and 2.2 eV and said second hydrogenated amorphous silicon nitride film having an optical band gap greater than that of said first hydrogenated amorphous silicon nitride film.

8. A nonlinear diode as recited in claim 7, wherein said optical bandgap of said second hydrogenated amorphous silicon nitride film is greater than 2.3 eV.

9. A nonlinear diode as recited in claim 7, wherein a thickness of said second hydrogenated amorphous silicon nitride film ranges from 1 nm to 10 nm.

10. A nonlinear diode as recited in claim 7, wherein a thickness of said second hydrogenated amorphous silicon nitride film ranges from 1 nm to 10 nm.

11. A nonlinear diode as recited in claim 7, wherein said first electrode is a chromium electrode.

12. A nonlinear diode as recited in claim 8, wherein said first electrode is a chromium electrode, said first hydrogenated amorphous silicon nitride film being on said first electrode, and said second electrode being on said second hydrogenated amorphous silicon nitride film.

13. A nonlinear diode as recited in claim 9, wherein said first electrode is a chromium electrode, said first hydrogenated amorphous silicon nitride film being on said first electrode, and said second electrode being on said second hydrogenated silicon nitride film.

14. A nonlinear diode as recited in claim 10, wherein said first electrode is a chromium electrode, said first amorphous silicon nitride film being on said first electrode, and said second electrode being on said second hydrogenated amorphous silicon nitride film.

15. A nonlinear diode as recited in claim 7, wherein said optical bandgap of said second hydrogenated amorphous silicon nitride film is greater than 2.5 eV.

16. A nonlinear diode as recited in claim 7, wherein a thickness of said second hydrogenated amorphous silicon nitride film ranges from 0.5 nm to 10 nm.

17. A nonlinear diode as recited in claim 15, wherein a thickness of said second hydrogenated amorphous silicon nitride film ranges from 0.5 nm to 10 nm.

18. A nonlinear diode as recited in claim 7, wherein said first electrode is an indium tin oxide electrode.

19. A nonlinear diode as recited in claim 15, wherein said first electrode is an indium tin oxide electrode, said second hydrogenated amorphous silicon nitride film being on said first electrode.

20. A nonlinear diode as recited in claim 16, wherein said first electrode is an indium tin oxide electrode, said second hydrogenated amorphous silicon nitride film being on said first electrode.

21. A nonlinear diode as recited in claim 17, wherein said first electrode is an indium tin oxide electrode, said second amorphous silicon nitride film being on said first electrode.

22. A nonlinear diode as recited in claim 7, further comprising an additional hydrogenated amorphous silicon nitride film between said second electrode and said first hydrogenated amorphous silicon nitride film, said additional hydrogenated amorphous silicon nitride film having an optical bandgap greater than that of said first hydrogenated amorphous silicon nitride film, and said second hydrogenated amorphous silicon nitride film being on said first electrode.

23. A nonlinear diode as recited in claim 22, wherein said first electrode is an indium tin oxide electrode.

* * * * *

UNITED STATES PATENT AND TRADEMARK OFFICE
CERTIFICATE OF CORRECTION

PATENT NO. : 5,053,832
DATED : October 1, 1991
INVENTOR(S) : Hiroyuki Uchida

It is certified that error appears in the above-identified patent and that said Letters Patent is hereby corrected as shown below:

Column 10, line 46, change "between" to --from--;

change "and" (first occurrence) to --to--.

Claim 10, column 10, line 56, change "7" to --8--.

Signed and Sealed this

Twenty-fifth Day of May, 1993

Attest:

MICHAEL K. KIRK

*Attesting Officer*     *Acting Commissioner of Patents and Trademarks*